(12) United States Patent
Gong et al.

(10) Patent No.: US 8,188,730 B2
(45) Date of Patent: May 29, 2012

(54) METHOD AND SYSTEM FOR INDUCTIVE PROXIMITY SENSING THAT INCLUDES MOUNTING EFFECT COMPENSATION

(75) Inventors: Xiaofeng Gong, Shanghai (CN); Wei S. Qian, Shanghai (CN); Weihua Chen, Westford, MA (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 566 days.

(21) Appl. No.: 12/207,737

(22) Filed: Sep. 10, 2008

(65) Prior Publication Data
US 2010/0060270 A1 Mar. 11, 2010

(51) Int. Cl.
*G01B 7/14* (2006.01)
(52) U.S. Cl. ......... 324/207.26; 324/207.13; 324/207.14; 324/207.15; 324/207.17; 324/236; 324/225; 324/207.11; 324/207.16; 324/207.23
(58) Field of Classification Search ............. 324/207.26, 324/207.13, 207.14, 207.15, 207.17, 225, 324/236, 207.11, 20, 7.16, 207.23
See application file for complete search history.

(56) References Cited

U.S. PATENT DOCUMENTS

| | | | | |
|---|---|---|---|---|
| 5,535,142 A * | 7/1996 | Mehnert et al. | ................ | 702/189 |
| 5,742,161 A * | 4/1998 | Karte | ........................ | 324/207.16 |
| 5,952,822 A * | 9/1999 | Kayserman et al. | ...... | 324/207.12 |
| 6,208,134 B1 * | 3/2001 | Demma | .................... | 324/207.26 |
| 6,449,577 B1 * | 9/2002 | Timpe | ........................... | 702/118 |
| 6,545,464 B1 | 4/2003 | Tigges | | |
| 6,552,666 B1 * | 4/2003 | Goto et al. | ................ | 340/870.32 |
| 6,603,306 B1 * | 8/2003 | Olsson et al. | ............. | 324/207.26 |
| 7,127,369 B2 * | 10/2006 | Fukumura et al. | ............. | 702/150 |
| 7,274,189 B2 * | 9/2007 | Chen et al. | ................ | 324/207.26 |
| 7,276,897 B2 * | 10/2007 | Lee | ........................... | 324/207.17 |
| 7,675,285 B2 * | 3/2010 | Chen et al. | ................ | 324/207.26 |
| 7,994,777 B2 * | 8/2011 | Rollins et al. | ............ | 324/207.26 |
| 8,058,865 B2 * | 11/2011 | May | ......................... | 324/207.16 |
| 2003/0016008 A1 * | 1/2003 | Christensen | ............. | 324/207.26 |
| 2005/0225320 A1 * | 10/2005 | Lee | .......................... | 324/207.17 |
| 2006/0049827 A1 * | 3/2006 | Chen et al. | ................ | 324/207.26 |
| 2008/0054887 A1 * | 3/2008 | Lee | .......................... | 324/207.17 |
| 2008/0134727 A1 * | 6/2008 | May | ............................ | 68/12.02 |
| 2008/0174302 A1 * | 7/2008 | Lee et al. | ................. | 324/207.16 |
| 2009/0085560 A1 * | 4/2009 | Rollins et al. | ............ | 324/207.26 |
| 2009/0140727 A1 * | 6/2009 | Rollins et al. | ............ | 324/207.16 |

OTHER PUBLICATIONS

EP Patent Application No. 09 17 2085.4 European Partial Search Report; Dec. 10, 2010; 9 pages.

* cited by examiner

*Primary Examiner* — Huy Q Phan
*Assistant Examiner* — Lamarr Brown
(74) *Attorney, Agent, or Firm* — Whyte Hirschboeck Dudek S.C.; William R. Walbrun

(57) ABSTRACT

An inductive proximity sensor and related method for sensing a presence/position of a target, with mounting effect compensation, are disclosed. In at least one embodiment, the method includes providing a proximity sensor having first and second coils that are both at least indirectly in communication with control circuitry. The method also includes receiving respective first and second signals at least indirectly indicative of respective first and second electromagnetic field components respectively experienced by the first coil as influenced both by a target and a structure supporting the sensor and the second coil as influenced by the supporting structure. The method further includes determining by way of the circuitry a third signal based at least in part upon the first signal, as modified based at least in part upon the second signal, whereby the third signal is indicative of the presence or position of the target relative to the sensor.

25 Claims, 5 Drawing Sheets

|  | BASE-Q1 | |
|---|---|---|
| ΔQ2 | ACTUAL-Q1 | ... |
|  | ... | ... |
|  | ... | ... |
|  | ... | ... |
|  | ... | ... |
|  | ... | ... |
|  | ... | ... |
|  | ... | ... |
|  | ... | ... |

METHOD AND SYSTEM FOR INDUCTIVE PROXIMITY SENSING THAT INCLUDES MOUNTING EFFECT COMPENSATION

CROSS-REFERENCE TO RELATED APPLICATIONS

FIELD OF THE INVENTION

The present invention relates to sensing devices and, more particularly, to proximity sensors.

BACKGROUND OF THE INVENTION

Proximity sensors are used in various industries to detect when an object is nearby without any physical contact. A proximity sensor often emits an electromagnetic or electrostatic field, or a beam of electromagnetic radiation (infrared, for example), and looks for changes in the field or return signal. Various types of proximity sensors are available, including capacitive, magnetic and inductive. The proximity sensor is typically mounted to a base and the moving object being sensed is often referred to as the proximity sensor's target.

Inductive proximity sensors that operate by creating and sensing electromagnetic fields are particularly useful for sensing the presence/position of metallic objects, such as conveyors, lift tables and machine parts, while ignoring the presence of nonmetallic objects that may be positioned around the sensors. Although there are various manners of mounting inductive proximity sensors, a common manner of mounting such sensors is by inserting the sensor into an orifice within a metallic support structure such as a metallic wall. Typically, upon mounting an inductive proximity sensor in this manner, the sides of the sensors are in contact with the metallic wall and, in many circumstances, a front surface of the sensor that is intended to face a target is mounted flush with the surface of the surrounding metallic wall.

When mounted in this manner, an electromagnetic field created by the sensor can interact with the surrounding metal of the support structure, in addition to interacting with any target that may be present. Such an interaction with the surrounding metal is commonly known as "mounting effect", and the strength of such an interaction can depend upon various factors including the composition of the surrounding metal and its position relative to the sensor and particularly the sensor's front surface. The mounting effect can result in a deterioration of the sensor's performance in terms of sensitivity or accuracy. For example, the mounting effect can in some circumstances precipitate "false triggering" (sensing of a target when it is not yet within a particular range of the sensor).

More particularly in this regard, an inductive proximity sensor may be designed so as to detect the presence of a target if the electromagnetic field sensed via an electromagnetic coil within the sensor varies more than a threshold amount from a base value that is representative of the electromagnetic field that would be sensed in the absence of a target. However, the assumed base value or threshold amount may be appropriate only when the sensor is mounted upon a particular metallic supporting structure (or when the sensor is operating entirely independently of any such structure). If this is the case, the assumed base value or threshold amount may no longer be appropriate once the sensor is mounted upon a different metallic supporting structure, and thus experiences a different mounting effect, than what was assumed to be the case.

Various efforts have been made to combat the mounting effect and its negative consequences. In particular with respect to false triggering, some have attempted to mitigate this problem by employ a higher threshold, so that the mounting effect will not cause inappropriate meeting of the threshold as frequently. Unfortunately, adjusting the threshold level higher while maintaining the same measurement base value results in the sensor having a lower sensitivity and a reduced sensing distance.

Another manner of reducing the mounting effect that has been attempted involves the use of shielding rings. By wrapping an inductive proximity sensor in a metal ring (for example, a copper ring), it is often the case that the ring will suppress the mounting effect by reducing the magnetic field leakage between the sensor and the supporting structure. However, this method is unsatisfactory, since it cannot completely eliminate the leakage magnetic field and therefore the mounting effect still exists, and also since the suppression of the mounting effect is achieved at the cost of a reduced magnetic field at the target position, such that the sensitivity and sensing distance of the sensor is reduced. Still another method that has been tried involves compensating the mounting effect by manually adjusting certain sensor parameters (e.g., the sensor's base value) after it is mounted. Although this method can reduce the mounting effect, it is not widely implemented because it requires a user's additional manual commissioning.

For at least these reasons, therefore, it would be advantageous if an improved inductive proximity sensor could be developed in which the performance of the sensor was less susceptible to, and less diminished by, the mounting effect. More particularly, in at least some embodiments, it would be advantageous if such an improved sensor could achieve such levels of performance without experiencing (at least to the same degree) one or more of the above-described disadvantages associated with conventional methods of dealing with the mounting effect.

SUMMARY OF THE INVENTION

The present inventors have recognized the aforementioned disadvantages associated with conventional inductive proximity sensor designs, and have further recognized that an improved inductive proximity sensor can overcome one or more of these disadvantages by automatically sensing one or more characteristics of a supporting structure and automatically (or at least semi-automatically) adjusting the sensor's measurement base value and/or its sensing threshold, so as to compensate for the mounting effect. In at least some such embodiments, such an improved inductive proximity sensor can operate by employing both a first coil that is used to detect target(s) and a second coil that is used to detect the presence/position of (and, in at least some cases, composition of) the metal supporting structure that surrounds the sensor. More particularly, in at least some such embodiments, one or more values sensed by way of the second coil that are indicative of the influence/characteristic(s) of the metal supporting structure are used by a controller (and associated index data table) to modify the base value and/or threshold value that are used in conjunction with signals of the first coil to determine the presence/position of target(s) in a manner, so that the sensing of the target(s) can be achieved in a manner that is largely if not entirely independent of any mounting effect.

In at least some embodiments, the present invention relates to a method for sensing a presence or position of a target. The method includes providing a proximity sensor having a first coil and a second coil that are both at least indirectly in communication with control circuitry. The method further includes receiving a second signal from the second coil, the second signal being at least indirectly indicative of a second electromagnetic field component experienced by the second coil as influenced by a support structure upon which the proximity sensor is mounted, and receiving a first signal from the first coil, the first signal being indicative of a first electromagnetic field component experienced by the first coil as influenced both by the support structure and the target. The method additionally includes determining by way of the control circuitry a third signal based at least in part upon the first signal, as modified based at least in part upon the second signal, whereby the third signal is indicative of the presence or position of the target relative to the proximity sensor.

Additionally, in at least some embodiments, the present invention relates to an inductive proximity sensor capable of mounting effect compensation. The sensor includes a first coil capable of providing a first output signal representative of a first electromagnetic field component influenced by a presence or position of a target, and a second coil capable of providing a second output signal representative of a second electromagnetic field component influenced by a support structure upon which the inductive proximity sensor is mounted. The sensor also includes a processing component that is at least indirectly connected to the first coil and the second coil for receiving the first output signal and the second output signal, where the processing circuit is configured to utilize the second output signal to modify the first output signal to determine the presence or position of the target.

Further, in at least some embodiments, the present invention relates to an inductive proximity sensor with mounting effect compensation that includes a sensing portion and control circuitry. The sensing portion includes a housing including a front face, and a core positioned within and supported at least indirectly upon the housing, The sensing portion additionally includes a first coil with a central axis therethrough that is directed so as to extend through the front face toward an outer region in front of the front face within which can be positioned a target, the first coil being supported upon the core. The sensing portion also includes a second coil arranged substantially along the central axis coaxially with the first coil, the second coil having an inner diameter greater than an outer diameter of the first coil and supported at least indirectly by at least one of the core and the housing. The control circuitry is for controlling excitation of the first and second coils and receiving signals from the coils representative of electromagnetic field components experienced by the first and second coils.

DETAILED DESCRIPTION OF THE INVENTION

Figure 1A:
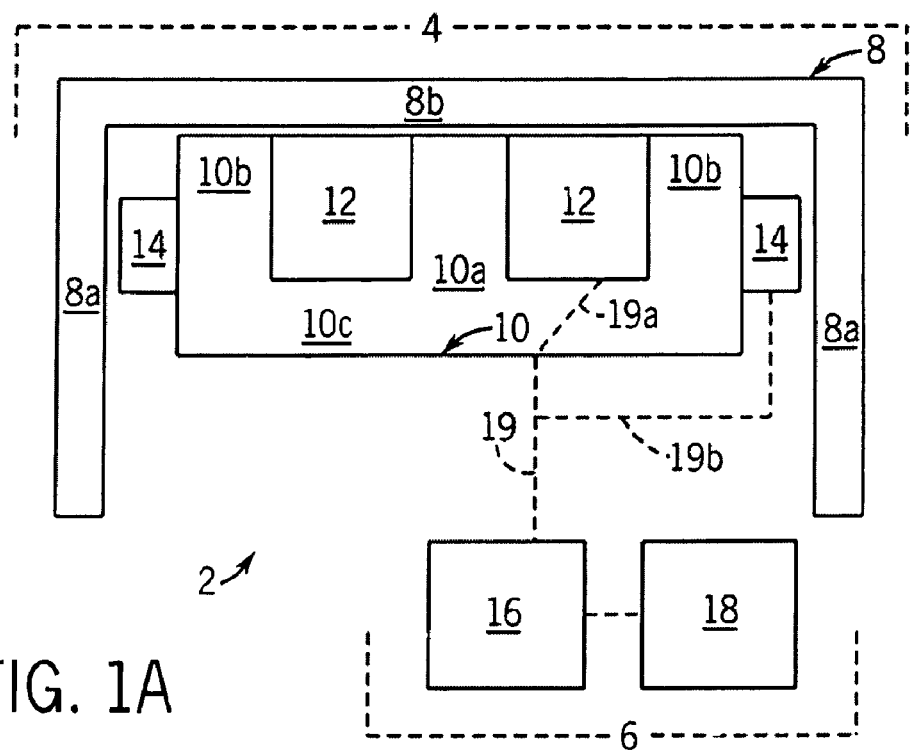
FIG. 1A is a schematic cross-sectional view of an exemplary inductive proximity sensor with a mounting effect compensation system, in accordance with one embodiment of the present invention.

Referring to FIG. 1A, a schematic cross-sectional view of an inductive proximity sensor with mounting effect compensation system (hereinafter referred to more simply as an "inductive proximity sensor") 2 in accordance with at least one embodiment of the present invention is shown. In the present embodiment, the inductive proximity sensor 2 is comprised of a sensing portion 4 and a processing portion 6. The sensing portion 4 includes a housing 8, a core 10, a first coil 12 and a second coil 14, each of which is substantially cylindrical (that is, rotationally symmetrical), with FIG. 1A showing a cross-sectional view taken along diameters of those components. In the present embodiment, the core 10 is comprised of a ferrite material, and includes an inner core portion 10a, an outer core portion 10b and a back portion 10c from which the core portions 10a, 10b extend forward. Both the first and second coils 12 and 14 are formed from copper wire and are mounted upon the core 10 forward of the back portion 10c. As shown, the first coil 12 extends annularly around the inner core portion 10a, the outer core portion 10b forms a rim around the first coil, and the second coil 14 extends annularly around the outer core portion 10b.

Further as shown, the housing 8 is generally cup-shaped and more particularly includes a housing side 8a that forms a cylindrical rim around the assembly of the core 10 and coils 12, 14, as well as a housing face 8b that caps the housing side at the front end of the housing. The assembly of the core 10 and coils 12, 14 is thus positioned within the housing 8, with the core portions 10a, 10b extending frontward from the back portion 10c of the core toward the housing face 8b. That is, the housing 8 substantially encloses the core 10, the first coil 12 and the second coil 14. Depending upon the embodiment, the housing 8 can be made of a non-metallic material such as plastic or a metallic material with a low resistance to magnetic fields, such as stainless steel, or possibly made from other materials as well. Additionally, although the housing 8 and the core 10 are preferably cylindrically symmetric, they can also be embodied in various other shapes, for example, square, oval, or otherwise oblong.

Additionally as shown in FIG. 1A, the processing portion 6 includes an evaluation circuit 16 having at least one index data table 18, the operation of which will be described further below. As illustrated schematically by a link 19, the evaluation circuit 16 is in communication with the assembly of the core 10 and the coils 12, 14 and in particular is capable of sending signals to and receiving signals from each of the first and second coils 12, 14 as represented by first and second link branches 19a and 19b, respectively. Depending upon the embodiment, the evaluation circuit 16 can take a variety of forms. For example, in some embodiments, the evaluation circuit 16 can be or include a microprocessor, an integrated circuit (e.g., an application specific integrated circuit) and/or a discrete circuit.

While FIG. 1A shows the processing portion 6 as being located proximate to the sensing portion 4, it will be understood that in various embodiments the processing portion 6 can be located in (e.g., within the housing 8), near, or remote from the sensing portion. In embodiments where the processing portion 6 is located remotely from the sensing portion 4, the two portions can communicate in a variety of manners, including by way of one more wireless or wired communication networks. In some such embodiments where the processing portion 6 is located remotely from the sensing portion 4, the sensing portion 4 will include an additional, intermediate control device that interfaces between the processing portion 6 and the coils 12, 14, and in particular drives and receives signals from the coils.

Figure 1B:
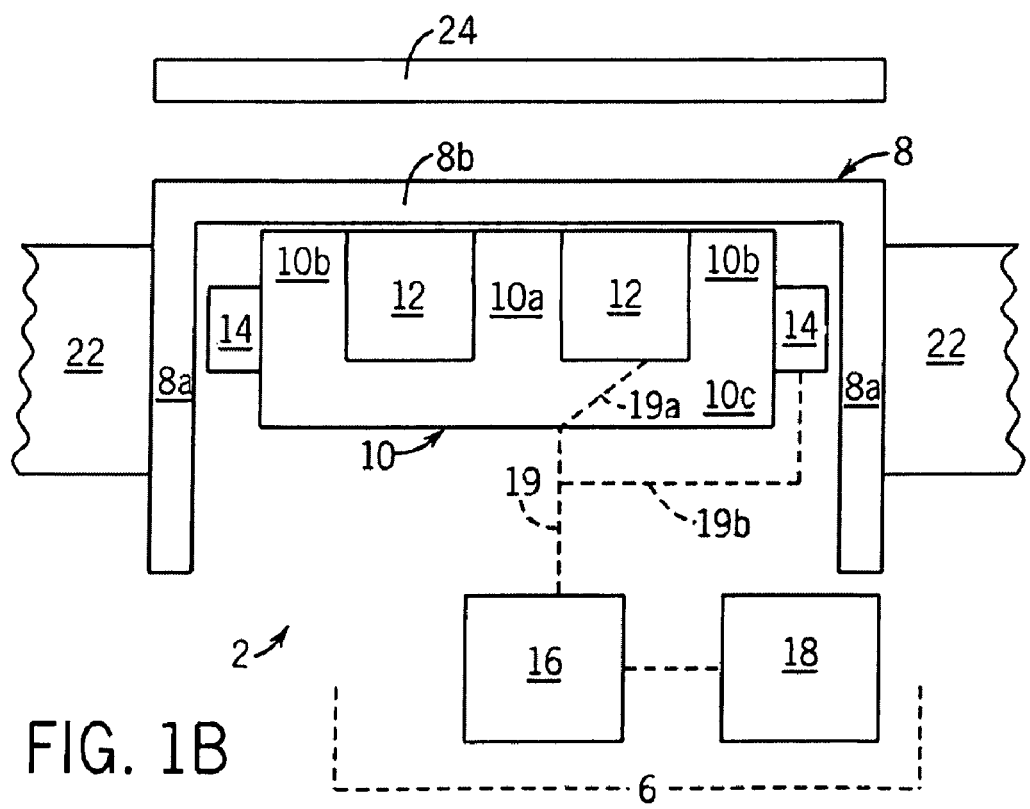
FIG. 1B is a schematic cross-sectional view of the inductive proximity sensor with mounting effect compensation system of FIG. 1A mounted in a surrounding metal wall shown in cutaway, and further shown in relation to a sensor target in accordance with one embodiment of the present invention.

Referring next to FIG. 1B, the inductive proximity sensor 2 is depicted with the sensing portion 4 in an installed position such that at least a portion of the housing side 8a is at least partially surrounded by a metallic supporting structure or "metal mount" 22. Additionally, a target 24 is depicted at a distance in front of (as shown in FIG. 1B, above) the housing face 8b. In the mounted position, the sensing portion 4 is subject to the mounting effect caused by the metal mount 22. By exciting and then detecting signals from both the first and second coils 12, 14, the processing portion 6 is able to determine the presence/position of the target 24 with relatively high accuracy in comparison with conventional inductive proximity sensors, notwithstanding the mounting effect. The second coil 14 is particularly useful for detecting the mounting effect since the second coil 14 is located radially outwardly of the first coil 12 and thus is positioned more closely to the metal mount 22 than is the first coil, such that the magnetic field generated by the second coil 14 is more strongly affected by the presence of the metal mount than is the magnetic field generated by the first coil.

More particularly, the processing portion 6 is able to determine the influence of the mounting effect by exciting the second coil 14 so as to generate a magnetic field and observing output (e.g., voltage via the second link branch 19b) from the coil that is indicative of the magnetic field's interaction with the metal mount 22. Based upon the observed output from the second coil 14, the processing portion 6 then consults a reference such as the index data table 18 to determine a compensation factor representative of the mounting effect. Subsequently, the processing portion 6 then operates so as to detect the presence/position of a target such as the target 24 by exciting the first coil 12 and observing output (e.g., voltage via the first link branch 19a), and then further modifying the output using the compensation factor to compensate for the mounting effect, the modified output being used to determine the presence/position of the target.

Figure 3A:
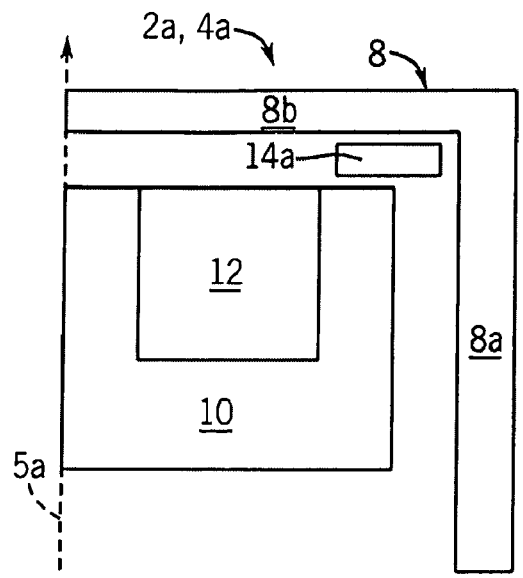
FIGS. 3A-3C are partial cross-sectional views of other inductive proximity sensors differing from that of FIGS. 1A-1B, in accordance with alternate embodiments of the present invention.

Notwithstanding the inductive proximity sensor shown in FIGS. 1A-1B, the present invention is intended to encompass a variety of other sensor arrangements as well. For example, turning to FIGS. 3A-3C, schematic cross-sectional views are provided of three alternate embodiments of sensing portions 4a, 4b, and 4c of three different inductive proximity sensors 2a, 2b and 2c differing from that of FIGS. 1A-1B. For compactness of illustration, only halves of the cross-sectional views of the sensing portions 4a, 4b and 4c, to the right of central axes 5a, 5b and 5c of the sensing portions are shown. More particularly, FIG. 3A shows a first alternate embodiment of sensing portion 4a that shares the same housing 8 (with the housing side 8a and housing face 8b), core 10 and first coil 12, but has a second coil 14a that differs in its position relative to the second coil 14 of FIGS. 1A-1B in that it is mounted adjacent to the housing side 8a between the core 10 and the housing face 8b.

Figure 3B:
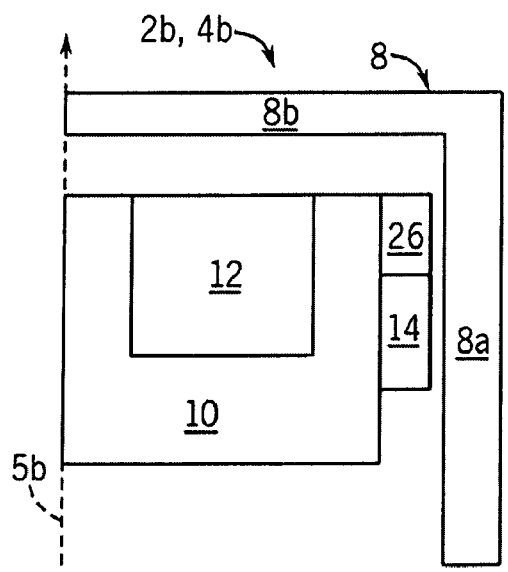
Figure 3C:
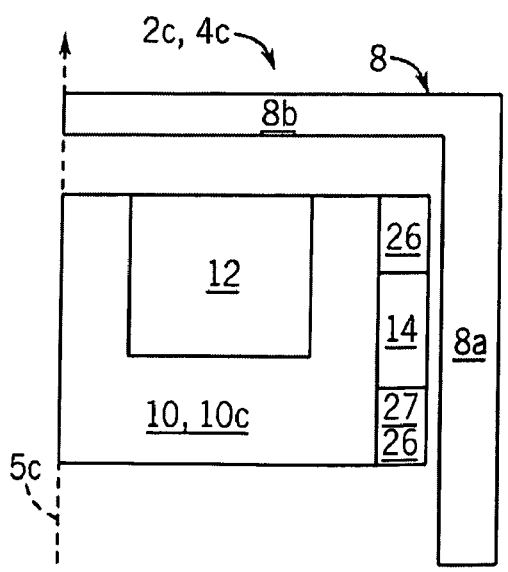

By comparison, FIG. 3B shows a second alternate embodiment of sensing portion 4b that also shares the same housing 8, core 10, and both of the first and second coils 12, 14 as are shown in FIGS. 1A-1B, but that additionally includes a portion of metal or core material 26 that encircles the core 10 in front of the second coil 14 (that is, adjacent to the second coil in between that coil and the housing face 8b). This configuration with the core material 26 can provide additional insulation for the second coil 14 from the first coil 12 and the target 24, and also reduce the effect of the first coil 12 on the second coil 14. Additionally, the second coil 14 is at least partially shielded from the sensing the target 24 by the core material 26. As for FIG. 3C, there is shown a third alternate embodiment of sensing portion 4c that is identical to that of FIG. 3B except insofar as a further portion of core material 27 that encircles the core 10 is provided to the rear of the second coil 14 (that, adjacent to the second coil and surrounding the back portion 10c of the core 10. This configuration can serve to further insulate the second coil 14.

Figure 5A:
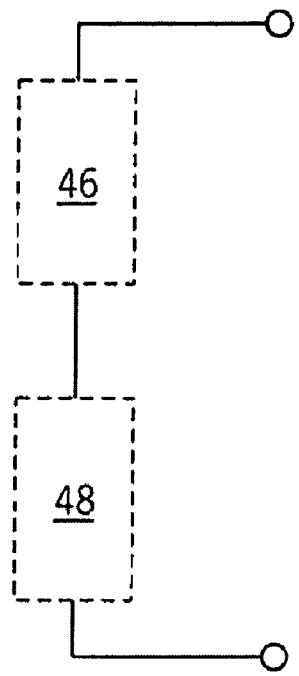
FIGS. 5A, 5B, 6A and 6B are several different exemplary schematics representing different manners of configuring and/or exciting the first and second coils (and associated tank circuits) in different embodiments of the inductive proximity sensor of FIGS. 1A-1B.
Figure 5B:
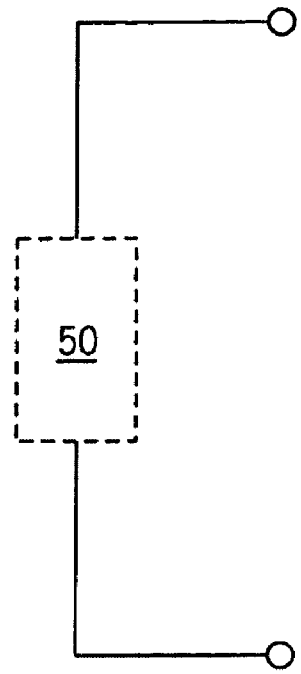

Turning to FIGS. 5A, 5B, 6A and 6B, several exemplary schematics are provided that represent different manners of configuring and/or exciting the first and second coils 12, 14 (and associated tank circuits) in several different embodiments of the inductive proximity sensor 2 of FIGS. 1A-1B. More particularly, FIG. 5A depicts a first coil tank circuit 46, which can be understood as including the first coil 12, and a second coil tank circuit 48, which can be understood as including the second coil 14, as being separate tank circuits that are connected in series. FIG. 5B by contrast depicts one joint tank circuit 50 that can be understood as including both of the first and second coils 12, 14. Each of the embodiments of FIGS. 5A and 5B can be understood as constituting forms of cascaded excitation.

Figure 6A:
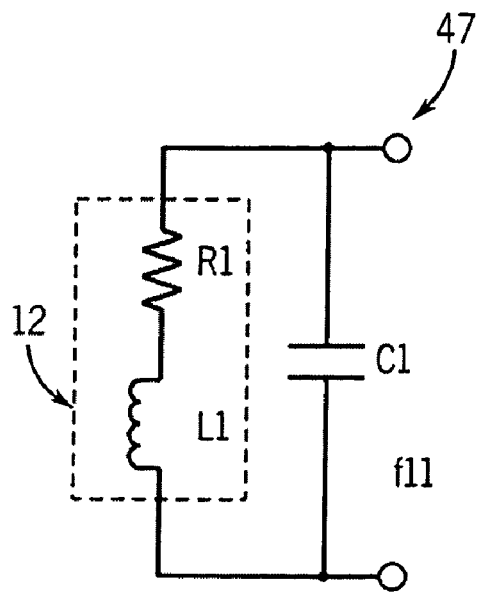
Figure 6B:
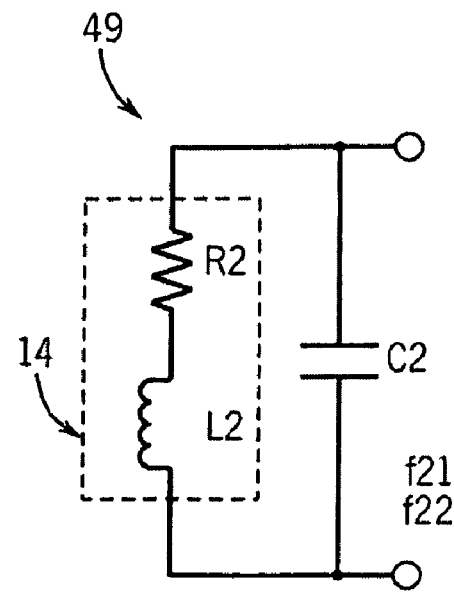

Additionally, FIGS. 6A and 6B show in more detail exemplary schematic representations of first and second tank circuits 47 and 49, respectively, which are to be separately excited rather than excited in a cascaded manner. More particularly, FIG. 6A depicts a first tank circuit 47 that includes the first coil 12 coupled in parallel with a capacitor C1, where the first coil is schematically represented as a series combination of a resistor R1 (representing the internal resistance of the coil) and an inductor L1. The first tank circuit 47 can be driven by a source so as to produce an electromagnetic field having a frequency f11. FIG. 6B by comparison depicts a second tank circuit 49 that includes the second coil 14 coupled in parallel with a capacitor C2, where the second coil is schematically represented as a series combination of a resistor R2 (again representing the internal resistance of the coil) and an inductor L2. Depending upon the embodiment (as will be discussed further below), the second tank circuit 49 can be driven by a source so as to produce a single electromagnetic field having a frequency f21, or two electromagnetic fields having first and second frequencies f21 and f22, respectively. As will be discussed further below, embodiments of the inductive proximity sensor 2 in which the second tank circuit 49 is driven at two different frequencies can achieve improved levels of detection accuracy. It will be noted that the capacitors C1 and C2 of FIGS. 6A-6B can be understood as being encompassed within either the sensing portion 4 or the processing portion 6 of the inductive proximity sensor 2.

As previously mentioned, inductive proximity sensors in accordance with embodiments of the present invention operate by sensing changes in the magnetic fields generated and experienced by the first and second coils 12, 14 (or 14a in the case of FIG. 3A) as a result of the position/nature of the metal mount 22 as well as the presence/position/nature of the target 24. One parameter that can serve as a useful measure of the changes in the magnetic fields generated and experienced by the first and second coils 12, 14 is the quality factor (Q) of the coil, which is defined as follows:

$$Q = \frac{2\pi * \text{MAXIMUM STORED ENERGY}}{\text{ENERGY DISSIPATION PER CYCLE}} \qquad (1)$$

In at least some embodiments of the present invention, values of Q (or change in Q, ΔQ) are measured at a time when the sensing portion 4 is not exposed to the metal mount 22 or the target 24, and/or at time(s) when the sensing portion 4 is exposed to different types of metal mounts. These measured values are used to generate (or populate) the index data table 18 (or possibly multiple such tables), which can then be used as a reference to calculate the mounting effect compensation for the first coil 12 when the inductive proximity sensor is being operated in the presence of the metal mount 22/target 24. While a variety of forms of the index data table 18 are possible depending upon the embodiment, FIGS. 2A and 2B are provided to show two exemplary forms of the index table.

Figures 2A, 2B:
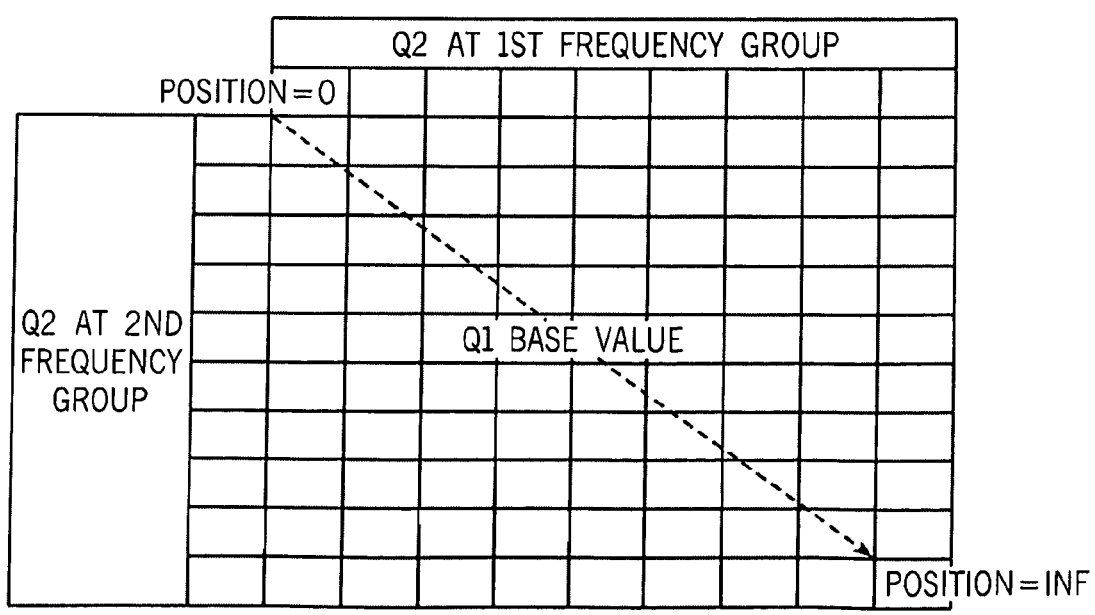
FIGS. 2A and 2B are exemplary embodiments of index data tables.

With respect to the index data table of FIG. 2A, in one embodiment of the present invention the index data table includes information correlating different values of Q1 compensation with different amounts of Q2 (more specifically, ΔQ2) that result from the presence of the metal mount 22. More particularly, the second coil 14 can be understood to have a base quality factor value ("base-Q2") that is measured while the second coil 14 is not exposed to the metal mount 22 (or to any other surrounding metal, including the target 24). To obtain base-Q2, the second coil 14 is excited at a first frequency (e.g., the frequency f21 mentioned above), creating a magnetic field thereabout, and then the base-Q2 is calculated using the above equation for Q (using sensed levels of current and voltage). Similarly, the first coil 12 can be understood to have a base quality factor value ("base-Q1") that is measured while the first coil 12 is not exposed to any target such as the target 24, nor to any other surrounding metal such as the metal mount 22. To obtain base-Q1, the first coil 12 is excited by an additional frequency (e.g., the frequency f11 mentioned above), creating a magnetic field thereabout, and then base-Q1 is calculated using the above equation for Q.

To further complete the index data table 18, changes in base-Q2 (ΔQ2) are measured while the second coil 14 is exposed to various surrounding metal configurations. At these times, the second coil 14 again is excited at the first frequency (e.g., f21), thereby creating a magnetic field that is effected by the surrounding metal and, again, the value of Q2 is calculated based on the effected magnetic field. Upon receiving the newly-calculated value of Q2, a ΔQ2 value equaling the difference between the newly-calculated value of Q2 and base-Q2 can be calculated. This process of calculating ΔQ2 values is repeated when the second coil 14 is in the proximity of a variety of different types of metal mounts, typically so that a wide sampling of ΔQ2 values can be generated that correspond to the type, quantity and proximity of the surrounding metal. Additionally as this is occurring, the first coil 12 continues to be excited at the additional frequency (e.g., f11), and new Q1 ("actual-Q1) values occurring with the presence of these different types of metal mounts but in the absence of any target are repeatedly measured.

The respective ΔQ2 values and respective actual-Q1 values that occur under exposure of the inductive proximity sensor 2 to surrounding metal of different respective structures/amounts/types are thus associated with one another. In particular, these values are used to populate the index data table so as to indicate how, with any given increase or decrease in ΔQ2, and assuming a particular surrounding metal, the base-Q1 value should be changed to a particular actual-Q1 value. Once created, the index data table 18 is stored in a manner accessible to the evaluation circuit 16. As should be evident from the above, the index data table 18 is, in at least the present embodiment, created and stored prior to installation of the sensing portion 4 in the metal mount 22 of an end-user (e.g., as may be found in a manufacturing assembly line).

Once installed in a particular end-user application employing a metal mount such as the metal mount 22, the first and second coils 12, 14 are again excited using the above-mentioned excitation frequencies (e.g., f11 and f21, respectively). ΔQ2 is calculated by the evaluation circuit 16 by measuring the Q2 value associated with the second coil 14 and then subtracting the base-Q2 value from that measured value (base-Q2 being previously stored and accessible to the evaluation circuit). The evaluation circuit 16 then inputs the measured ΔQ2 into the index data table 18 so as to generate the appropriate actual-Q1 value differing from the original base-Q1 (which was previously stored and is reflective of the Q1 value of the first coil 12 in the absence of supporting metal/target). Once the appropriate actual-Q1 value is determined, then any associated threshold Q1 values (e.g., a threshold value that is indicative of the detection of a target) can also be modified appropriately.

In utilizing the index data table 18, the evaluation circuit 16 can also in at least some circumstances take into account additional data that is reflective of one or more characteristics of the metal mount 22 (e.g., the type of metal). Such additional data can in some embodiments be input by a user when setting-up the inductive proximity sensor 2 in relation to the metal mount. Such data can be input, for example, by way of a keypad or other input device directly coupled to the evaluation circuit 16, or by way of another remote terminal (e.g., a computer or touch screen) coupled to the inductive proximity sensor 2 by way of a cable or wireless/wired network connection.

Once the actual-Q1 value that is appropriate given the implementation of the inductive proximity sensor 2 in conjunction with the particular metal mount 22 has been determined, the inductive proximity sensor 2 is ready to be used to sense targets such as the target 24. More particularly, the inductive proximity sensor 2 continues to excite the first coil 12 and, when the target 24 enters the magnetic field of the first coil 12, it causes a change in the sensed Q1 value. The evaluation circuit 16 then is able to compare the sensed Q1 value to the actual-Q1 value to determine an overall change in the Q1 value (ΔQ1). The ΔQ1 value can then be compared by the evaluation circuit 16 with the threshold. If the ΔQ1 value is larger than the set threshold, the target 24 is identified as detected by the inductive proximity sensor 2. Thus, by utilizing the calculated actual-Q1 value (and its associated threshold, as appropriate), the effect of the metal mount 22 is compensated for. More particularly, the inductive proximity sensor 2 allows the sensing portion 4 to be adjacent to the metal mount 22 without compromising sensitivity in detecting the target 24.

Notwithstanding the above discussion in relation to the index data table of FIG. 2A, in at least some additional embodiments a different index data table can be used by the inductive proximity sensor 2, as shown in FIG. 2B. As shown, this index data table is a two-dimensional index data table that correlates various actual-Q1 values, which are experienced by the tank circuit associated with the first coil 12 when excited in the presence of different types of surrounding metal but in the absence of any target, with pairs of Q2 (or ΔQ2) values that are experienced by the tank circuit associated with the second coil 14 (again when excited in the presence of the respective types of surrounding metal but in the absence of any target). In contrast with the index data table of FIG. 2A, the index table of FIG. 2B is in particular is created by exciting the second coil 14 at two different frequencies (e.g., at the frequencies f21 and f22) rather than merely at a single frequency as discussed above.

When the inductive proximity sensor 2 is eventually implemented within the metal mount 22 (but with the target 24 not yet in proximity to the sensor) in an operational setting, the second coil 14 again is excited at each of the first and second frequencies f21 and f22, respectively), so as to determine Q2 (or ΔQ2) values at these frequencies. The measured Q2 values at the pair of frequencies are inputted by the evaluation circuit 16 into the index data table of FIG. 2B to generate an appropriate actual-Q1 value, which can then again be used by the evaluation circuit in making determinations as to the presence or absence of the target 24. Further, use of the index data table of FIG. 2B by the inductive proximity sensor 2 when implemented in a given operational setting can allow for enhanced performance of the inductive proximity sensor relative to situations in which the index table of FIG. 2A is only used. In particular, the use of the index table of FIG. 2B allows the actual-Q1 level to be accurately determined by the evaluation circuit 16 in the absence of any further information being provided by an operator/user regarding any characteristics of the metal mount 22. Rather, simply by sensing the pair of Q2 values at the pair of frequencies (f21 and f22), the entire effect (or substantially the entire effect) of any given metal mount having any given configuration, shape, type, material upon the first coil 12 can be determined and compensated for.

Figure 4:
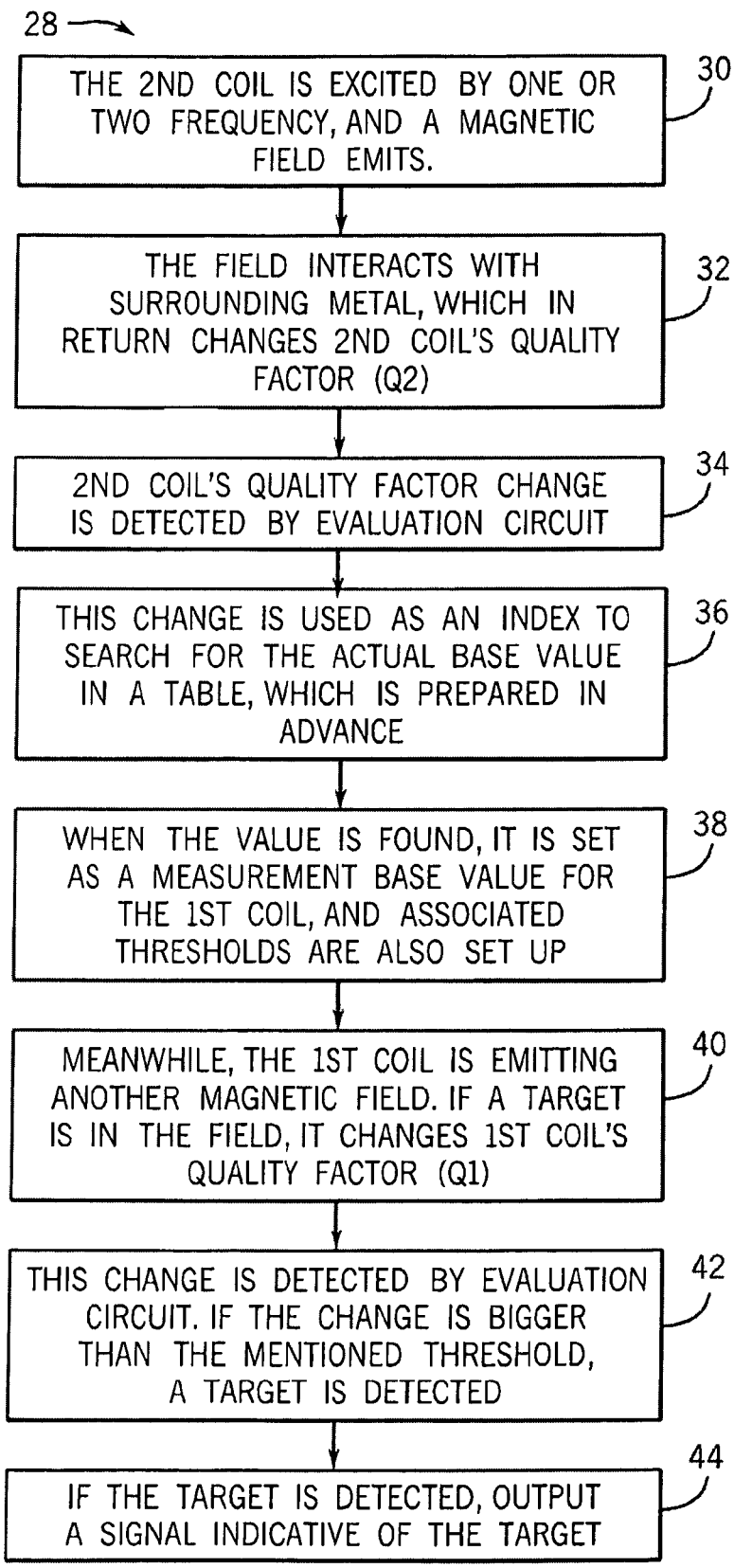
FIG. 4 is a flow diagram showing exemplary steps of operation that can be performed by the sensors of FIGS. 1A-1B, and 3A-3C.

Turning to FIG. 4, a flow diagram 28 is provided that illustrates in more detail exemplary steps of operation that can be performed by an inductive proximity sensor such as any of the sensors 2a-2b described above to detect a target 24 in a manner that is largely if not substantially free of the mounting effect. Beginning at a step 30, the second coil 14 is excited at one or two frequencies to produce a resultant magnetic field. Next, at a step 32, the magnetic field interacts with the surrounding metal of the metal mount 22, so as to produce a change in the quality factor (Q2) of the second coil 14 relative to what it would otherwise be in the absence of the metal mount (typically a known value). Further, at a step 34, the evaluation circuit 16 detects the change in Q2 (e.g., based upon the voltage signal received from the second coil 14 via the link branch 19b). At a step 36, the detected change in Q2 is used as an index value with respect to the index data table, by which the evaluation circuit 16 is able to determine a corresponding actual base value for the first coil 12.

Next, at a step 38, the evaluation circuit 16 sets a measurement base value for the first coil 12 as equaling the actual base value obtained from the index data table 18. For example, while a presumed measurement base value for the first coil 12 may be a value X, the actual base value obtained from the index data table 18 may be a value Y different from X and, in that case, the evaluation circuit resets the value for the measurement base value as being equal to Y. Further, to the extent that the inductive proximity sensor has one or more thresholds above the assumed base value that when satisfied are intended to serve as indication(s) of the presence/position(s) of target(s), these thresholds are also adjusted to reflect the measurement base value. Again for example, assuming that the measurement base value was reset from X to Y, where Y=X+Z, then the thresholds may also be increased by the amount Z.

Subsequent to these adjustments made at the step 38, the sensing portion 4 is now ready to detect the target 24, at a step 40. At this step, the first coil 12 is excited to emit a magnetic field to sense if the target 24 is present/sufficiently close to the first coil 12. If no target is present, then the quality factor of the first coil 12 (Q1) should maintain a measurement base value of X. However, if the target 24 is present and sufficiently close to the first coil 12, the magnetic field experienced by the first coil changes, thereby resulting in a change of Q1. Subsequently at a step 42, the evaluation circuit 16 detects the change in Q1 (again for example based upon the voltage output of the first coil 12 as received via the link branch 19a) and compares it to one or more of the previously-adjusted threshold value(s). If the change in Q1 is larger than the threshold value, the target 24 is detected. Finally, at a step 44, upon detecting a target, an output signal acknowledging that the target 24 has been detected is provided by the evaluation circuit 16. Such an output signal can take the form of an analog or digital signal transmitted via a wired or wireless network, a switching on of a light associated with the sensor, or any of a variety of other forms.

In at least some embodiments, the evaluation circuit can process multiple sensing portions separately or simultaneously and can provide one or more output signals. As already noted, the output signal(s) from any of the inductive proximity sensors 2-2c can be communicated via wired or wireless connection(s) to a local or remote location(s), and also in other embodiments, visual and/or audible notification of the target detection (or absence of a target) is possible. Further, in some embodiments, the inductive proximity sensors are capable of receiving command signals or other information from external devices by way of any of a variety of connections.

Additionally, while the index data table embodiments discussed with reference to FIGS. 2A and 2B envision correlation between Q2 and Q1 values where the Q2 values are obtained by exciting the second coil 14 at one or two frequencies, in other embodiments more than two frequencies could be used to further calculate additional Q2's and provide possibly even more accurate detection of the mounting plane and composition of the metal mount 22 (and its effect upon the fields associated with the first coil 12). Further, while index data tables are employed above to correlate Q2 and Q1 values, in other embodiments other manners of correlation are used including, for example, one or more formulas that accurately (or substantially accurately) capture correlations between Q2 and Q1 values. Also, it has been contemplated that in at least some embodiments the evaluation circuit 16 can be used with the sensing portion 4 to provide substantially equal sensing thresholds for both ferrous and non-ferrous targets.

It is specifically intended that the present invention not be limited to the embodiments and illustrations contained herein, but include modified forms of those embodiments including portions of the embodiments and combinations of elements of different embodiments as come within the scope of the following claims.

We claim:

1. A method for sensing a presence or position of a target comprising:
providing a proximity sensor having a first coil and a second coil that are both at least indirectly in communication with control circuitry;
receiving a second signal from the second coil, the second signal being at least indirectly indicative of a second electromagnetic field component experienced by the second coil as influenced by a support structure upon which the proximity sensor is mounted;
receiving a first signal from the first coil, the first signal being indicative of a first electromagnetic field component experienced by the first coil as influenced both by the support structure and the target; and determining by way of the control circuitry a third signal based at least in part upon the first signal, as modified based at least in part upon the second signal, wherein the determining includes consulting an index data table correlating values potentially indicated by the second signal with corresponding values potentially indicated by the first signal, and whereby the third signal is indicative of the presence or position of the target relative to the proximity sensor.

2. The method of claim 1, wherein the second signal is indicative of a change in a second quality factor associated with a second tank circuit including the second coil, the change in the second quality factor occurring due to the presence of the support structure.

3. The method of claim 2, wherein the second signal is received prior to a time at which the target is substantially in proximity to the proximity sensor.

4. The method of claim 2, wherein the third signal is indicative of a difference between a measured quality factor associated with a first tank circuit including the first coil when the target is substantially in proximity to the proximity sensor, and an adjusted base quality factor associated with the first tank circuit when the target is substantially absent in relation to the proximity sensor.

5. The method of claim 4, wherein the second signal is used to generate an adjustment factor by which an original base quality factor associated with the first tank circuit is modified to arrive at the adjusted base quality factor.

6. The method of claim 5, further comprising:
receiving a fourth signal from the second coil, the fourth signal being at least indirectly indicative of a third electromagnetic field component experienced by the second coil as influenced by a support structure upon which the proximity sensor is mounted, wherein the second signal is received in response to first excitation of the second coil at a first excitation frequency and the fourth signal is received in response to second excitation of the second coil at a second excitation frequency.

7. The method of claim 1, further comprising:
developing at least one correlation between a first plurality of quality factor values respectively experienced by the first coil when in the presence of a first plurality of structures respectively and a second plurality of quality factor values respectively experienced by the second coil when in the presence of the first plurality of structures respectively.

8. The method of claim 7, wherein at least one of the following is true:
(a) the developing occurs prior to implementation of the proximity sensor in relation to the support structure; and
(b) the at least one correlation is represented by at least one of an index data table and a formula.

9. The method of claim 1, further comprising:
determining a threshold value of the third signal that, if met, is indicative of the presence or position of the target; and
comparing the third signal with the threshold value to determine the presence or position of the target.

10. An inductive proximity sensor capable of mounting effect compensation, the sensor comprising:
a first coil capable of providing a first output signal representative of a first electromagnetic field component influenced by a presence or position of a target;
a second coil capable of providing a second output signal representative of a second electromagnetic field component influenced by a support structure upon which the inductive proximity sensor is mounted; and
a processing component that is at least indirectly connected to the first coil and the second coil for receiving the first output signal and the second output signal,
wherein the processing circuit is configured to utilize the second output signal to modify the first output signal to determine the presence or position of the target,
wherein the processing component is configured to determine at least one correlation between a first plurality of quality factor values associated with the second coil and a second plurality of quality factor values associated with the first coil,
wherein the processing component stores an index data table by which the processing component is capable of determining the at least one correlation, the index data table correlating the first plurality of quality factor values and the second plurality of quality factor values,
wherein the first plurality of quality factor values are associated with the second coil and respectively representative of a first plurality of possible electromagnetic field components that are experienced by the second coil when in the presence of a first plurality of different supporting structures, and
wherein the second plurality of quality factor values are associated with the first coil and respectively representative of a second plurality of possible electromagnetic field components that are experienced by the first coil when in the presence of the first plurality of different supporting structures, respectively.

11. The inductive proximity sensor of claim 10, further comprising a first tank circuit including the first coil and a second tank circuit including the second coil.

12. The inductive proximity sensor of claim 10, further comprising a core upon which are supported the first and second coils.

13. The inductive proximity sensor of claim 12, further comprising a housing within which are positioned each of the core and the first and second coils, wherein the housing and the core are each cylindrically symmetric.

14. The inductive proximity sensor of claim 12, wherein the first coil is supported by the core proximate a front face of the sensor.

15. The inductive proximity sensor of claim 14, wherein the core includes an outer annular portion that extends around a circumference of the first coil.

16. The inductive proximity sensor of claim 15, wherein the second coil extends around and is supported by an outer circumference of the core.

17. The inductive proximity sensor of claim 16, wherein at least one additional annular portion is positioned at least one of axially in front and axially rearward of the second coil relative to a front face of the sensor, the at least one additional annular portion having an inner diameter substantially equal to that of the second coil and being made of at least one core material.

18. The inductive proximity sensor of claim 14, wherein the second coil is positioned axially in front of the first coil relative to the front face of the sensor, and wherein the second coil has an inner diameter that exceeds an outer diameter of the first coil.

19. The inductive proximity sensor of claim 10, wherein the first plurality of quality factor values includes a third plurality of quality factor values representative of a third plurality of possible electromagnetic field components that are experienced by the second coil when excited at a first frequency, and includes a fourth plurality of quality factor values representative of a fourth plurality of possible electromagnetic field components that are experienced by the second coil when excited at a second frequency.

20. An inductive proximity sensor with mounting effect compensation comprising:
   a sensing portion including:
      a housing including a front face;
      a core positioned within and supported at least indirectly upon the housing;
      a first coil with a central axis therethrough that is directed so as to extend through the front face toward an outer region in front of the front face within which can be positioned a target, the first coil being supported upon the core; and
      a second coil arranged substantially along the central axis coaxially with the first coil, the second coil having an inner diameter greater than an outer diameter of the first coil and supported at least indirectly by at least one of the core and the housing; and
   control circuitry for controlling excitation of the first and second coils and receiving signals from the coils representative of electromagnetic field components experienced by the first and second coils.

21. The inductive proximity sensor of claim 20, wherein the control circuitry is capable of generating an output signal indicative of a presence or a position of the target within the outer region, the output signal being based upon a first signal received from the first coil that is representative of a first electromagnetic field experienced by the first coil and influenced by the presence or position of the target, as modified by a second signal received from the second coil that is representative of a second electromagnetic field component experienced by the second coil and influenced by a presence of a supporting structure proximate to the inductive proximity sensor.

22. The inductive proximity sensor of claim 20, wherein the control circuitry includes means for correlating a first plurality of signal values indicative of first electromagnetic field components respectively experienced by the first coil when in the presence of a plurality of different sensor supporting structures, respectively, and a second plurality of signal values indicative of second electromagnetic field components respectively experienced by the second coil when in the presence of the plurality of different sensor supporting structures, respectively.

23. The inductive proximity sensor of claim 20, wherein at least one of the following is true:
   (a) the control circuitry is in communication with at least one input or output device that is capable of displaying an indication of a target presence and a target position; and
   (b) the control circuitry is configured for communication with a remote terminal by of at least one of a wired network and a wireless network.

24. The inductive proximity sensor of claim 10, wherein the processing component is configured to determine the at least one correlation by way of one or more formulas.

25. A method for sensing a presence or position of a target comprising:
   providing a proximity sensor having a first coil and a second coil that are both at least indirectly in communication with control circuitry;
   receiving a second signal from the second coil, the second signal being at least indirectly indicative of a second electromagnetic field component experienced by the second coil as influenced by a support structure upon which the proximity sensor is mounted;
   receiving a first signal from the first coil, the first signal being indicative of a first electromagnetic field component experienced by the first coil as influenced both by the support structure and the target;
   determining by way of the control circuitry a third signal based at least in part upon the first signal, as modified based at least in part upon the second signal,
   whereby the third signal is indicative of the presence or position of the target relative to the proximity sensor, and
   developing at least one correlation between a first plurality of quality factor values respectively experienced by the first coil when in the presence of a first plurality of structures respectively and a second plurality of quality factor values respectively experienced by the second coil when in the presence of the first plurality of structures respectively,
   wherein at least one of the following is true:
   (a) the developing occurs prior to implementation of the proximity sensor in relation to the support structure; and
   (b) the at least one correlation is represented by at least one of an index data table and a formula.

* * * * *